(12) United States Patent
Kim

(10) Patent No.: US 9,472,260 B1
(45) Date of Patent: Oct. 18, 2016

(54) SEMICONDUCTOR MEMORY DEVICE

(71) Applicant: SK hynix Inc., Gyeonggi-do (KR)

(72) Inventor: Kyung-Whan Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/858,860

(22) Filed: Sep. 18, 2015

(30) Foreign Application Priority Data

Apr. 22, 2015 (KR) .................. 10-2015-0056587

(51) Int. Cl.
*G11C 11/406* (2006.01)
*G11C 11/408* (2006.01)

(52) U.S. Cl.
CPC ........ *G11C 11/40618* (2013.01); *G11C 11/408* (2013.01)

(58) Field of Classification Search
CPC .......... G11C 11/406; G11C 11/40615; G11C 11/40618
USPC ......................................................... 365/222
See application file for complete search history.

(56) References Cited

U.S. PATENT DOCUMENTS

| | | | |
|---|---|---|---|
| 7,180,809 B2* | 2/2007 | Lee ....................... | G11C 11/406 365/222 |
| 2009/0248972 A1 | 10/2009 | Ware et al. | |
| 2014/0355332 A1* | 12/2014 | Youn ................. | G11C 11/40615 365/149 |

FOREIGN PATENT DOCUMENTS

KR       1020140070303       6/2014

* cited by examiner

*Primary Examiner* — Hoai V Ho
*Assistant Examiner* — Tri Hoang
(74) *Attorney, Agent, or Firm* — IP & T Group LLP

(57) ABSTRACT

A semiconductor memory device may include: a plurality of banks suitable for performing an all bank refresh operation or single bank refresh operation; an address output control unit suitable for generating a plurality of output control signals in response to a single bank refresh pulse signal; an address latch unit suitable for outputting a target row address of a bank corresponding to an activated output control signal; and an address output unit suitable for outputting a row address adjacent to the target row address to a selected bank.

18 Claims, 3 Drawing Sheets

SEMICONDUCTOR MEMORY DEVICE

CROSS-REFERENCE TO RELATED APPLICATIONS

The present application claims priority of Korean Patent Application No. 10-2015-0056587, filed on Apr. 22, 2015, which is incorporated herein by reference in its entirety.

BACKGROUND

1. Field

This patent document relates to a semiconductor design technology, and more particularly, to a semiconductor memory device which performs a refresh operation.

2. Description of the Related Art

Semiconductor memory devices such as DRAM include memory banks for storing data, and each of the memory banks includes a large number of memory cells. Each of the memory cells includes a cell transistor serving as a switch and a cell capacitor for storing data. Since leakage of current occurs due to the memory cell structure, particularly in the PN junction of the cell transistor, data stored in the cell capacitor may be lost. Therefore, semiconductor memory devices require refresh operations of recharging the memory cells before data is lost (hereafter, referred to as a 'normal refresh operation').

A normal refresh operation may include an auto refresh operation and a self refresh operation. An auto refresh operation occurs in response to a refresh command applied from outside (i.e. an external source), and a self-refresh operation occurs when the semiconductor memory device changes an internal address in response to a refresh command applied from outside.

In addition to normal refresh operations, a semiconductor memory device may perform an additional refresh operation on memory cells coupled to a word line that is likely to lose data due to row hammering. Row hammering is a phenomenon in which data of a memory cell is lost due to repeated activations of adjacent word lines. In order to prevent loss of data from row hammering, an additional refresh operation is performed on word lines that are activated a predetermined number of times or more. This operation is typically referred to as a target-row refresh (TRR) operation.

The TRR operation is divided into a single bank refresh operation and an all bank refresh operation. The single bank refresh operation refers to when only one bank is refreshed, and the all bank refresh operation refers to when all the banks are refreshed.

During an all bank refresh operation, target row addresses for all of the banks are output. As a target-row refresh (TRR) signal is activated during the all bank refresh operation, the semiconductor memory device may activate an output control signal for controlling the output timing of a target row address of a first bank. Then, the semiconductor memory device may shift the output control signal of the first bank and sequentially activate output control signals of the other banks to perform the TRR operation on all of the banks.

During a single bank refresh operation, the semiconductor memory device performs a refresh operation whenever a single bank refresh command containing specific bank information is applied from outside. The single bank refresh operation is also referred to as a per bank refresh operation.

During a conventional single bank refresh operation, the semiconductor memory device may generate a short pulse in response to the single bank refresh command containing the bank information. Thus, the semiconductor memory device may output a target row address of the corresponding bank and perform the TRR operation.

However, when the single bank refresh operation is performed through the above-described method, the single bank refresh operation and the all bank refresh operation may overlap since the TRR signal activated during the all bank refresh operation is the same signal as the TRR signal activated during the single bank refresh operation. Thus, although the single bank refresh operation is performed in response to the single bank refresh command applied from outside, the output control signal of the first bank, which is activated during the all bank refresh operation, may be automatically activated. In this case, the single bank refresh operation and the all bank refresh operation may overlap. Therefore, the semiconductor memory device may have difficulty in normally performing the single bank refresh operation.

SUMMARY

Various embodiments are directed to a semiconductor memory device capable of generating row addresses of word lines which are adjacent to a target word line that is highly accessed.

Also, various embodiments are directed to a semiconductor memory device capable of independently performing an all bank refresh operation and a single bank refresh operation.

In an embodiment, a semiconductor memory device may include: a plurality of banks suitable for performing an all bank refresh operation or single bank refresh operation; an address output control unit suitable for generating a plurality of output control signals corresponding to the all bank refresh operation or the single bank refresh operation in response to a single bank refresh pulse signal; an address latch unit suitable for outputting a target row address of a bank corresponding to an activated output control signal; and an address output unit suitable for outputting a row address adjacent to the target row address to a selected bank.

The semiconductor memory device may further include: a refresh pulse generation unit suitable for generating the single bank refresh pulse signal for selectively refreshing any one of the banks in response to a single bank refresh command during the single bank refresh operation.

The address output control unit may include: a single bank output control signal generation unit suitable for generating a plurality of single bank output control signals in response to a row active signal and the single bank refresh pulse signal; an all bank output control signal generation unit suitable for generating a plurality of all bank output control signals in response to the row active signal and a target-row refresh (TRR) signal activated during the all bank refresh operation or single bank refresh operation; and an output control signal generation unit suitable for generating the plurality of output control signals when any of the single bank output control signals and the all bank output control signals is activated.

The single bank output control signal generation unit may comprise a single bank output control signal generator for each of the banks.

Each of the single bank output control signal generators may include: a pulse generator suitable for generating a row active pulse signal based on the row active signal; and a latch suitable for generating the single bank output control signal in response to the row active pulse signal and the single bank refresh pulse signal.

The latch may include an RS latch which receives the single bank refresh pulse signal as a set signal, and receives the row active pulse signal as a reset signal.

The all bank output control signal generation unit may activate a first all bank output control signal when the TRR signal is activated, and sequentially activates the remaining all bank output control signals after the first all bank output control signal in synchronization with an activation of the row active signal.

The output control signal generation unit may comprise a plurality of output control signal generators, each of which generates a corresponding one of the output control signals, wherein second to last output control signal generators except for a first output control signal generator have the same structure.

Each of the second to last output control signal generators may include: a logic gate suitable for performing an OR operation on a corresponding single bank output control signal and a corresponding all bank output control signal.

The first output control signal generator may include: an output selection section suitable for selectively outputting a first all bank output control signal in response to the single bank output control signals; and an output section suitable for outputting the first output control signal in response to a first single bank output control signal and an output signal of the output selection section.

The output selection section may include: a logic gate suitable for performing an OR operation on the single bank output control signals; and a multiplexer suitable for selectively outputting the first all bank output control signal or an inverted signal of the first all bank output control signal in response to an output signal of the logic gate.

The output section may comprise a logic gate suitable for performing an OR operation on the first single bank output control signal and the output signal of the output selection section.

The address output unit may include: an arithmetic unit suitable for changing the target row address in response to a flag signal; and a multiplexer suitable for selectively outputting the row address or the target row address outputted from the arithmetic unit in response to a target-row refresh (TRR) signal.

The plurality of banks may receive a row active signal and the row address or the target row address outputted from the multiplexer, and perform the all bank refresh operation or the single bank refresh operation.

DETAILED DESCRIPTION

Figure 1:
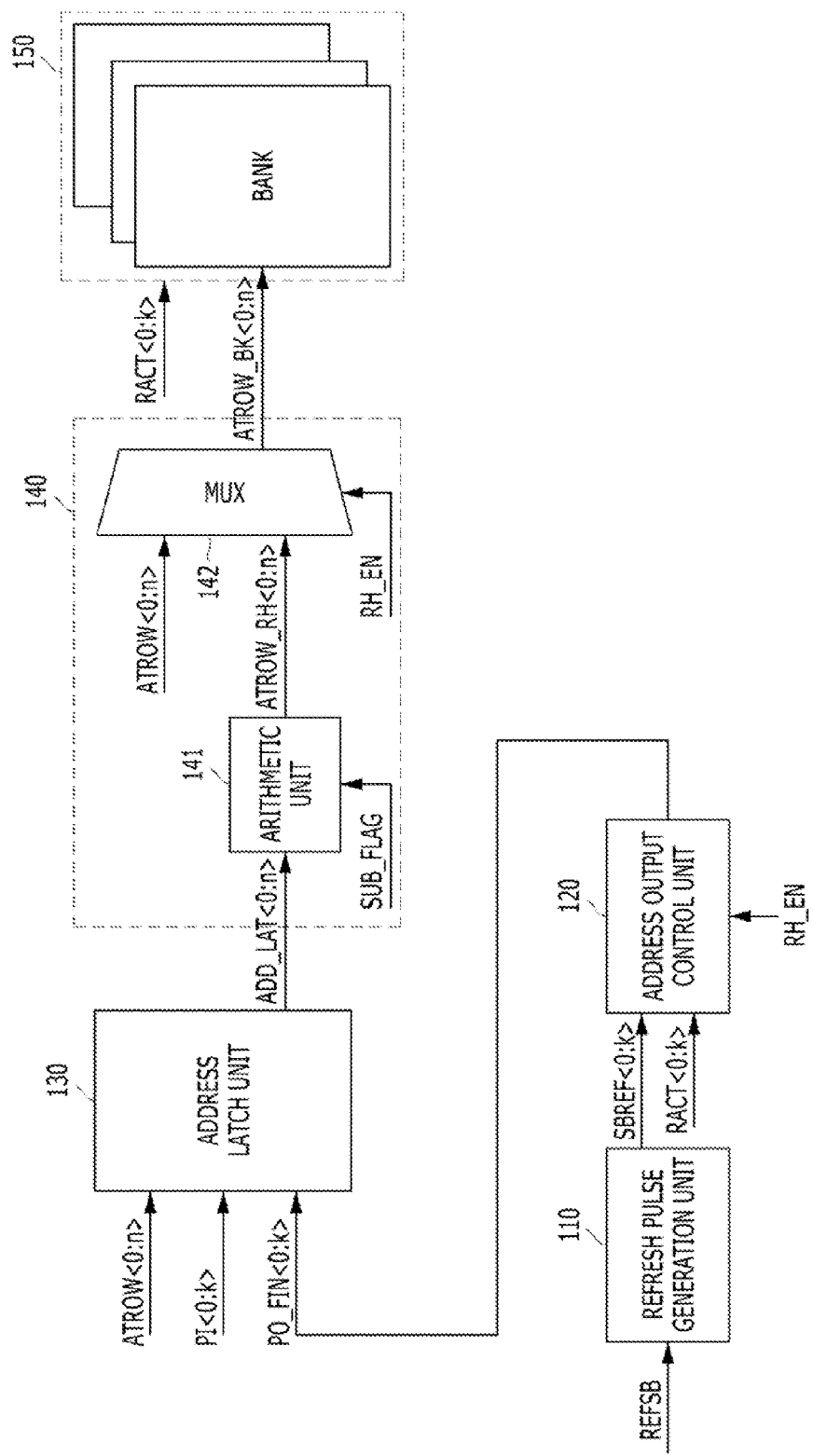
FIG. 1 is a block diagram illustrating a semiconductor memory device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts.

FIG. 1 is a block diagram illustrating a semiconductor memory device in accordance with an embodiment of the present invention.

Referring to FIG. 1, the semiconductor memory device may include a refresh pulse generation unit 110, an address output control unit 120, an address latch unit 130, an address output unit 140, and a plurality of banks 150.

The refresh pulse generation unit 110 may receive a single bank refresh command REFSB from outside, and generate a plurality of single bank refresh pulse signals SBREF<0:k>. The single bank refresh command REFSB may include bank address information. The refresh pulse generation unit 110 may activate a single bank refresh pulse signal corresponding to the bank address information contained in the single bank refresh command REFSB, among the plurality of single bank refresh pulse signals SBREF<0:k>.

The address output control unit 120 may receive the single bank refresh pulse signals SBREF<0:k> and row active signals RACT<0:k>, and generate a plurality of output control signals PO_FIN<0:k> for controlling an output timing of a row address inputted to a corresponding bank during a refresh operation. Each of the row active signals RACT<0:k> may be activated after a predetermined time from the activation of a corresponding one of the single bank refresh pulse signals SBREF<0:k>. The address output control unit 120 will be described in detail with reference to FIG. 2.

The address latch unit 130 may latch a row address ATROW<0:n> in response to an input control signal PI<0:k> and output the row address ATROW<0:n> in response to the output control signal PO_FIN<0:k>. The row address ATROW<0:n> may be a normal row address for performing a refresh operation during a normal operation. The input control signals PI<0:k> may control the timing at which the row addresses ATROW<0:n> corresponding to the plurality of banks are stored in the address latch unit 130, and the output control signals PO_FIN<0:k> may control the timing at which the row addresses ATROW<0:n> stored in the address latch unit 130 are outputted as target row addresses ADD_LAT<0:n>.

That is, the input control signals PI<0:k> and the output control signals PO_FIN<0:k> may control the timing at which a corresponding target row address is stored in or outputted from a specific bank among the plurality of banks 150. For example, the first input control signal PI<0> among the plurality of input control signals PI<0:k> may control the timing at which the target row address corresponding to a first bank (not illustrated) among the plurality of banks 150 is stored in the address latch unit 130, and the first output control signal PO_FIN<0> among the plurality of output control signals PO_FIN<0:k> may control the timing at which the target row address corresponding to the first bank and stored in the address latch unit 130 is outputted.

The address output unit 140 may output an address adjacent to the target row address ADD_LAT<0:n> to a selected bank among the plurality of banks 150. The address output unit 140 may include an arithmetic unit 141 and a multiplexer 142.

The arithmetic unit 141 may increase or decrease the target row address ADD_LAT<0:n> outputted from the address latch unit 130 in response to a flag signal SUB_FLAG, and output a row address ATROW_RH<0:n> adjacent to the target row address ADD_LAT<0:n>. The adjacent address may indicate an address of a word line adjacent to a word line corresponding to the target row address ADD_LAT<0:n>. For example, when the target row address ADD_LAT<0:n> is an address corresponding to an nth word line, the adjacent address may indicate an address corresponding to an (n−1) or (n+1)th word line. The flag signal SUB_FLAG may control the arithmetic unit 141 to increase or decrease the target row address ADD_LAT<0:n> by '1'. That is, the arithmetic unit 141 may output the row address ATROW_RH<0:H> corresponding to an address adjacent to the target row address ADD_LAT<0:n>. The row address ATROW_RH<0:n> of the adjacent word line, outputted from the arithmetic unit 141, may be inputted to the multiplexer 142.

The multiplexer 142 may select the row address ATROW<0:n> or the row address ATROW_RH<0:n> of the adjacent word line, outputted from the arithmetic unit 141, in response to a target-row refresh (TRR) signal RH_EN and output the selected address as an output row address ATROW_BK<0:n>. The row address ATROW<0:n> may indicate a normal row address for performing a refresh operation during a normal operation. The row address ATROW_RH<0:n> of the adjacent word line may indicate a row address for performing a refresh operation on an adjacent word line of a target word line as well as the target word line which is activated a predetermined number of times or more.

The plurality of banks 150 may perform a refresh operation on a target word line of a selected bank in response to the row active signals RACT<0:k> and the output row address ATROW_BK<0:n> outputted from the multiplexer 142.

Figure 2:
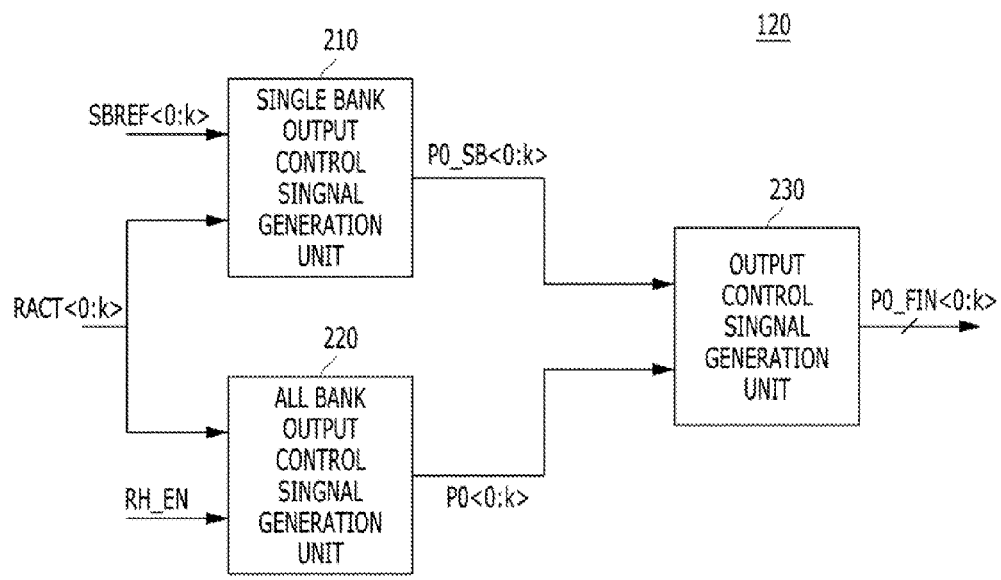
FIG. 2 is a block diagram illustrating an address output control unit of FIG. 1.

FIG. 2 is a detailed block diagram illustrating the address output control unit 120 of FIG. 1.

Referring to FIG. 2, the address output control' unit 20 may include a single bank output control signal generation unit 210 an all bank output control signal generation unit 220 and an output control signal generation unit 230.

The single bank output control signal generation unit 210 may generate a plurality of single bank output control signals PO_SB<0:k> in response to the plurality of row active signals RACT<0:k> and the single bank refresh pulse signals SBREF<0:k>. Each of the plurality of single bank output control signals PO_SB<0:k> may control the output timing of a row address corresponding to a corresponding bank during a single bank refresh operation. Though it is not illustrated in FIG. 2, the single bank output control signal generation unit 210 may include a plurality of single bank output control signal generators for each of the banks.

The all bank output control signal generation unit 220 may generate a plurality of all bank output control signals PO<0:k> in response to the plurality of row active signals RACT<0:k and the TRR signal RH_EN activated during a TRR operation. Among the plurality of all bank output control signals PO<0:k> the first all bank output control signal PO<G> may be automatically activated when the TRR signal RH_EN is activated, and the remaining all bank output control signals PO<1:k> generated after the first all bank output control signal PO<0> may be sequentially activated in synchronization with the activation of the respective row active signals RACT<0:k>.

The output control signal generation unit 230 may generate the plurality of output control signals PO_FIN<0:k when any of the single bank output control signals PO_SB<0:k> and the all bank output control signals PO<0:k> are activated.

Figure 3:
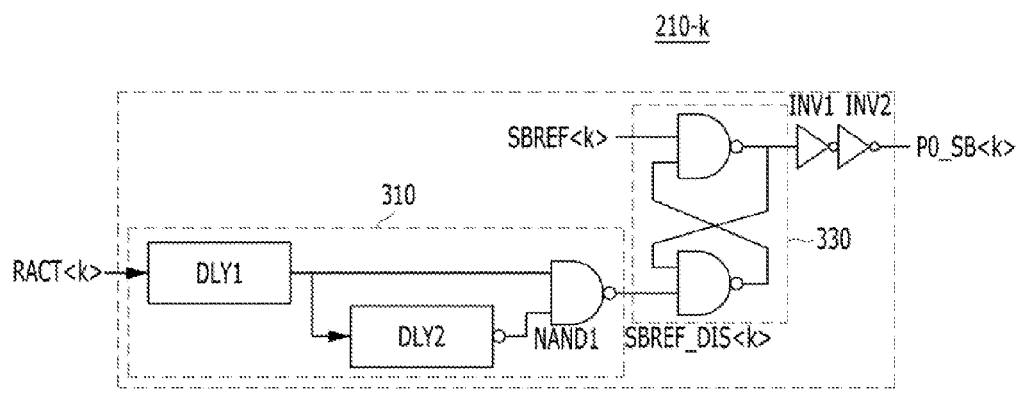
FIG. 3 is a circuit diagram illustrating a single bank output control signal generator included in a single bank output control signal generation unit of FIG. 2.

FIG. 3 is a circuit diagram illustrating a single bank output control signal generator included in the single bank output control signal generation unit 210 of FIG. 2. For reference, the single bank output control signal generation unit 210 includes first to (K+1)th single bank output control signal generators, each of which generates a corresponding one of the single bank output control signals PO_SB<0:k>. Since the (K+1)th single bank output control signal generator 210_K has substantially the same structure as those of the remaining generators, the (K+1)th single bank output control signal generator 210_K is explained in FIG. 3 as an example.

Referring to FIG. 3, the single bank output control signal generator 210_K may include a pulse generator 310 and a latch 330. The pulse generator 310 may generate a row active pulse signal SBREF_DIS<k> based on the row active signal RACT<k>. The latch 330 may generate the single bank output control signal PO_SB<k> in response to the row active pulse signal SBREF_DIS<k> and the single bank refresh pulse signal SBREF<k>.

In detail, the pulse generator 310 may include first and second delays DLY1 and DLY2 and a NAND gate NAND1. The first delay DLY1 may delay the row active signal RACT<k> of the corresponding bank by a predetermined time. The second delay DLY2 may delay and invert an output of the first delay DLY1 by a predetermined time. The NAND gate NAND1 performs a NAND operation on outputs of the first and second delays DLY1 and DLY2 to output the row active pulse signal SBREF_DIS<k>.

The latch 330 may include an RS latch which receives the single bank refresh pulse signal SBREF<k> as a set signal, and receives the row active pulse signal SBREF_DIS<k> as a reset signal. That is, the latch 330 may output an output signal which is activated in response to the single bank refresh pulse signal SBREF<k>, and deactivated in response to the row active pulse signal SBREF_DIS<k>.

The single bank output control signal generator 210_K may further include a buffer comprising first and second inverters INV1 and INV2. The output signal may be outputted as the single bank output control signal PO_SB<k> through the first and second inverters INV1 and INV2.

Since the single bank output control signal PO_SB k> is generated in response to the single bank refresh pulse signal SBREF<k> and the row active signal RACT<k> corresponding to the bank, the single bank output control signal PO_SB<k> may be independently generated even when the bank address information is not sequentially inputted but randomly inputted.

Figure 4:
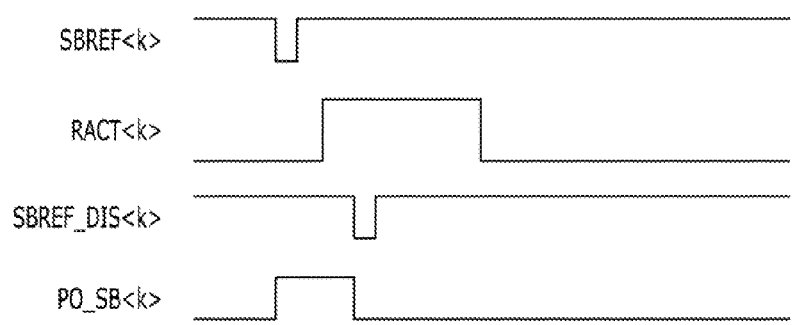
FIG. 4 is a timing diagram illustrating an operation of the single bank output control signal generator of FIG. 3.

FIG. 4 is a timing diagram illustrating an operation of the single bank output control signal generator 210_K of FIG. 3.

Referring to FIG. 4, the single bank output control signal PO_SB<k> may be activated when the single bank refresh pulse signal SBREF<k> is generated.

After the single bank refresh pulse signal SBREF<k> is generated and delayed by a predetermined time, the row active signal RACT<k> of the corresponding bank may be activated. The row active pulse signal SBREF_DIS<k> may be generated by the pulse generator 310, after a predetermined time from the activation of the row active signal RACT<k>. The single bank output control signal PO_SB<k> activated in response to the single bank refresh pulse signal SBREF<k> may be deactivated in response to the row active pulse signal SBREF_DIS<k>.

That is, since the single bank output control signal PO_SB<k> is generated in response to the row active signal RACT<k> and the single bank refresh pulse signal SBREF<k> containing bank information, the single bank output control signal PO_SB<k> may be independently generated at each selected bank.

Figure 5:
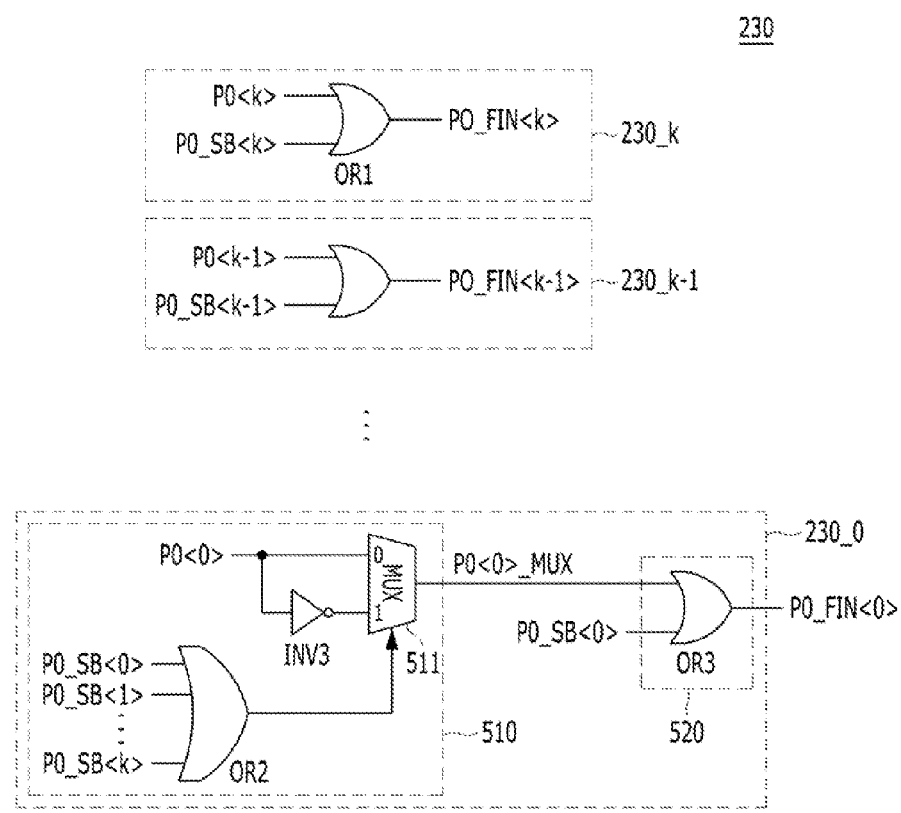
FIG. 5 is a circuit diagram illustrating an output control signal generation unit of FIG. 2.

FIG. 5 is a circuit diagram illustrating the output control signal generation unit 230 of FIG. 2.

Referring to FIG. 5, the output control signal generation unit 230 may include a plurality of output control signal generators 230_0 to 230_K, each of which generates a corresponding one of the output control signals PO_FIN<0:k>. Since the (K+1)th output control signal generator 230_K has substantially the same structure as those of the second to Kth generators, except for the first output control signal generator 230_0, the (K+1)th output control signal generator 230_K is explained as an example.

The (K+1)th output control signal generator 230_K may include a first OR gate OR1 which performs an OR operation on the all bank output control signal PO<k> and the single bank output control signal PO_SB<k> to output the output control signal PO_FIN<k>. That is, the output control signal PO_FIN<k> may be outputted when any of the all bank output control signal PO<k> and the single bank output control signal PO_SB<k> is activated. Since the all bank refresh operation and the single bank refresh operation are not performed at the same time, a signal generated through the corresponding operation may be used as the output control signal PO_FIN<k>.

Since the first all bank output control signal PO<0> is automatically activated when the TRR signal RH_EN is activated, the first all bank output control signal PO<0> may be activated even when the TRR signal RH_EN activated during the single bank refresh operation is activated. In order to prevent such an activation, the address output control unit 120 may include the first output control signal generator 230_0.

The first output control signal generator 230_0 may include an output selection section 510 and an output section 520.

The output selection section 510 may selectively output the first all bank output control signal PO<0> as an all bank selection signal PO<0>_MUX in response to the single bank output control signals PO_SB<0:k>. The output section 520 may output the first output control signal PO_FIN<0> in response to the all bank selection signal PO<0>_MUX and the first single bank output control signal PO_SB<0>.

In detail, the output selection section 510 may include a second OR gate OR2 and a multiplexer 511.

The second OR gate OR2 may activate an output signal when any one of the single bank output control signals PO_SB<0:k> generated from the single bank output control signal generation unit 220 is activated.

The multiplexer 511 may selectively output the first all bank output control signal PO<0> or an inverted signal of the first all bank output control signal, which is inverted through an inverter INV3, in response to the output signal of the second OR gate OR2. The first all bank output control signal PO<0> may be activated when the TRR signal RH_EN is activated, regardless of the all bank refresh operation or the single bank refresh operation. Thus, the first all bank output control signal PO<0> may be activated even during the single bank refresh operation. Therefore, when any one of the single bank output control signals PO_SB<0:k> generated during the single bank refresh operation is activated, an activation of the first all bank control signal PO<0> may be prevented.

The output section 520 may include a third OR gate OR3 which performs an OR operation on the all bank selection signal PO<0>_MUX and the single bank output control signal PO_SB 0> to output the first output control signal PO_FIN<0>.

Thus, during the single bank refresh operation, the first output control signal generator 230_0 may block the activation of the first all bank control signal PO<0> and output the first single bank output control signal PO_SB<0> instead of the all bank selection signal PO<0>_MUX outputted from the multiplexer 511, as the first output control signal PO_FIN<0>.

In short, when a target row address is outputted during a single bank refresh of a TRR operation, the output timing of the target row address may be independently controlled according to a selected bank. Thus, the TRR operation may be independently performed at each bank.

Furthermore, when the target row address is outputted during the single bank refresh operation of the TRR operation, the semiconductor memory device may control the target row address not to overlap a target row address of the all bank refresh operation. Thus, the single bank refresh operation of the TRR operation may be normally performed.

In accordance with the embodiments of the present invention, when a specific word line is accessed numerous times, the semiconductor memory device may generate row addresses of word lines which are physically adjacent to the specific word line. Thus, stress or disturbance caused to neighboring memory cells during the refresh operation may be reduced, which makes it possible to prevent the degradation in data retention time of the memory cells.

Furthermore, the single bank refresh operation may avoid overlapping the all bank refresh operation, and the row address of the target word line of a specific bank and word lines adjacent to the target word line may be generated. Thus, the TRR operation may be independently performed at each bank.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
a plurality of banks suitable for performing an all bank refresh operation or single bank refresh operation;
an address output control unit suitable for generating a plurality of output control signals corresponding to the all bank refresh operation or the single bank refresh operation in response to a single bank refresh pulse signal;
an address latch unit suitable for outputting a target row address of a bank corresponding to an activated output control signal; and
an address output unit suitable for outputting a row address adjacent to the target row address to a selected bank,
wherein the address output control unit comprises:
a single bank output control signal generation unit suitable for generating a plurality of single bank output control signals in response to a row active signal and the single bank refresh pulse signal; and
an all bank output control signal generation unit suitable for generating a plurality of all bank output control signals in response to the row active signal and a target-row refresh (TRR) signal activated during the all bank refresh operation or single bank refresh operation.

2. The semiconductor memory device of claim 1, further comprising:
a refresh pulse generation unit suitable for generating the single bank refresh pulse signal for selectively refreshing any one of the banks in response to a single bank refresh command during the single bank refresh operation.

3. The semiconductor memory device of claim 1, wherein the address output control unit further comprises:
an output control signal generation unit suitable for generating the plurality of output control signals when any of the single bank output control signals and the all bank output control signals is activated.

4. The semiconductor memory device of claim 3, wherein the single bank output control signal generation unit comprises a single bank output control signal generator for each of the banks.

5. The semiconductor memory device of claim 4, wherein each of the single bank output control signal generators comprises:
a pulse generator suitable for generating a row active pulse signal based on the row active signal; and
a latch suitable for generating the single bank output control signal in response to the row active pulse signal and the single bank refresh pulse signal.

6. The semiconductor memory device of claim 5, wherein the latch includes an RS latch which receives the single bank refresh pulse signal as a set signal, and receives the row active pulse signal as a reset signal.

7. The semiconductor memory device of claim 3, wherein the all bank output control signal generation unit activates a first all bank output control signal when the TRR signal is activated, and sequentially activates the remaining all bank output control signals after the first all bank output control signal in synchronization with an activation of the row active signal.

8. The semiconductor memory device of claim 3, wherein the output control signal generation unit comprises a plurality of output control signal generators, each of which generates a corresponding one of the output control signals,
wherein second to last output control signal generators except for a first output control signal generator have the same structure.

9. The semiconductor memory device of claim 8, wherein each of the second to last output control signal generators comprises:
a logic gate suitable for performing an OR operation on a corresponding single bank output control signal and a corresponding all bank output control signal.

10. The semiconductor memory device of claim 8, wherein the first output control signal generator comprises:
an output selection section suitable for selectively outputting a first all bank output control signal in response to the single bank output control signals; and
an output section suitable for outputting the first output control signal in response to a first single bank output control signal and an output signal of the output selection section.

11. The semiconductor memory device of claim 10, wherein the output selection section comprises:
a logic gate suitable for performing an OR operation on the single bank output control signals; and
a multiplexer suitable for selectively outputting the first all bank output control signal or an inverted signal of the first all bank output control signal in response to an output signal of the logic gate.

12. The semiconductor memory device of claim 10, wherein the output section comprises:
a logic gate suitable for performing an OR operation on the first single bank output control signal and the output signal of the output selection section.

13. The semiconductor memory device of claim 1, wherein the address output unit comprises:
an arithmetic unit suitable for changing the target row address in response to a flag signal; and
a multiplexer suitable for selectively outputting the row address or the target row address outputted from the arithmetic unit in response to a target-row refresh (TRR) signal.

14. The semiconductor memory device of claim 13, wherein the plurality of banks receive a row active signal and the row address or the target row address outputted from the multiplexer, and perform the all bank refresh operation or the single bank refresh operation.

15. A semiconductor memory device comprising:
a plurality of banks suitable for performing an all bank refresh operation or single bank refresh operation;
an address output control unit suitable for generating a plurality of output control signals corresponding to the all bank refresh operation or the single bank refresh operation in response to a single bank refresh pulse signal;
an address latch unit suitable for outputting a target row address of a bank corresponding to an activated output control signal; and
an address output unit suitable for outputting a row address adjacent to the target row address to a selected bank,
wherein the address output unit comprises:
an arithmetic unit suitable for changing the target row address in response to a flag signal; and
a multiplexer suitable for selectively outputting the row address or the target row address outputted from the arithmetic unit in response to a target-row refresh (TRR) signal.

16. The semiconductor memory device of claim 15, further comprising:
a refresh pulse generation unit suitable for generating the single bank refresh pulse signal for selectively refreshing any one of the banks in response to a single bank refresh command during the single bank refresh operation.

17. The semiconductor memory device of claim 15, wherein the plurality of banks receive a row active signal and the row address or the target row address outputted from the multiplexer, and perform the all bank refresh operation or the single bank refresh operation.

18. The semiconductor memory device of claim 15, wherein the address output control unit comprises:
a single bank output control signal generation unit suitable for generating a plurality of single bank output control signals in response to a row active signal and the single bank refresh pulse signal;
an all bank output control signal generation unit suitable for generating a plurality of all bank output control signals in response to the row active signal and a target-row refresh (TRR) signal activated during the all bank refresh operation or single bank refresh operation; and
an output control signal generation unit suitable for generating the plurality of output control signals when any of the single bank output control signals and the all bank output control signals is activated.

* * * * *